(12) United States Patent
Wang et al.

(10) Patent No.: US 9,886,999 B2
(45) Date of Patent: Feb. 6, 2018

(54) STATIC RAM FOR DIFFERENTIAL POWER ANALYSIS RESISTANCE

(71) Applicant: Ningbo University, Zhejiang (CN)

(72) Inventors: Pengjun Wang, Zhejiang (CN); Keji Zhou, Zhejiang (CN); Weiwei Chen, Zhejiang (CN); Yuejun Zhang, Zhejiang (CN)

(73) Assignee: Ningbo University, Zhejiang (CN)

( * ) Notice: Subject to any disclaimer, the term of this patent is extended or adjusted under 35 U.S.C. 154(b) by 0 days.

(21) Appl. No.: 15/437,452

(22) Filed: Feb. 21, 2017

(65) Prior Publication Data
US 2017/0243636 A1 Aug. 24, 2017

(30) Foreign Application Priority Data

Feb. 23, 2016 (CN) .......................... 2016 1 0099443

(51) Int. Cl.
*G11C 11/00* (2006.01)
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ........................... G11C 11/419; G11C 11/418

USPC ......................................................... 365/154
See application file for complete search history.

(56) References Cited

U.S. PATENT DOCUMENTS

2006/0120142 A1\* 6/2006 Yamagami ............ G11C 11/413
365/154

\* cited by examiner

*Primary Examiner* — Huan Hoang
(74) *Attorney, Agent, or Firm* — JCIPRNET (57) ABSTRACT

The present invention discloses a static RAM for defensive differential power consumption analysis, comprising a replica bit-line circuit, a decoder, an address latch circuit, a clock circuit, n-bit memory arrays, n-bit data selectors, n-bit input circuit and n-bit output circuits; the output circuits comprises a sensitivity amplifier and a data latch circuit; the 1st PMOS tube, the 2nd PMOS tube, the 3rd PMOS tube, the 4th PMOS tube, the 5th PMOS tube, the 6th PMOS tube, the 7th PMOS tube, the 1st NMOS tube, the 2nd NMOS tube, the 3rd NMOS tube, the 4th NMOS tube and the 5th NMOS tube constitute the sensitivity amplifier; two NOR gates, the 8th PMOS tube, the 9th PMOS tube, the 10th PMOS tube, the 11th PMOS tube, the 6th NMOS tube, the 7th NMOS tube, the 8th NMOS tube, the 9th NMOS tube and the 10th NMOS tube constitute the data latch circuit; the present invention is characterized in that energy consumption in each working cycle is basically identical, which is provided with higher capability in defense of differential power analysis.

2 Claims, 6 Drawing Sheets

STATIC RAM FOR DIFFERENTIAL POWER ANALYSIS RESISTANCE

CROSS-REFERENCE TO RELATED APPLICATION

This application claims the priority benefit of China application serial no. 201610099443.X, filed on Feb. 23, 2016. The entirety of the above-mentioned patent application is hereby incorporated by reference herein and made a part of this specification.

FIELD OF THE INVENTION

The present invention is related to a static RAM, in particular to a static RAM for Differential Power Analysis Resistance.

BACKGROUND ART

Static RAM is a high-performance memory extensively applied to the encrypted circuit; however, as the circuit power consumption is related to the data as read, it may be probably decoded by the differential power analysis. Output circuit of existing static RAM is single-terminal output; dual-rail pre-charge logic is not applicable to the design of static RAM due to the lack of fully identical complementary output; on the contrary, three-phase dual-rail pre-charge logic and self-timing three-phase dual-rail pre-charge logic can realize one-off charging/discharging for major nodes in each periodic circuit through addition of discharging process on SABL basis, which can overcome the disadvantage of power consumption difference incurred by inconsistent load and wiring capacitance; nevertheless, as they are requested to reset the output before the end of each cycle, it is impossible to keep the data as read; therefore, they are not applicable to the design of static RAM for defense of power attack.

SUMMARY OF THE INVENTION

The technical issue to be settled by the present invention is to provide a static RAM for Differential Power Analysis Resistance.

Technical solution used by the present invention to settle aforesaid technical issue is stated as follows: A static RAM for Differential Power Analysis Resistance, comprising a replica bit-line circuit, a decoder, an address data latch circuit, a clock circuit, n-bit memory arrays, n-bit data selectors, n-bit input circuits and n-bit output circuits; n is an integral equal to or over 1; the said decoder is connected to the said replica bit-line circuit, the said address data latch circuit, the said n-bit memory arrays and the said n-bit data selectors respectively; the said clock circuit is connected to the said replica bit-line circuit, the said n-bit input circuits, the said n-bit output circuits respectively; the said input circuit j is connected to the said data selector j; the said replica bit-line circuit is connected to the said n-bit output circuits; the said data selector j is connected to the said memory array j and the said output circuit j respectively; j=1, 2, . . . , n; the said output circuit comprises a sensitivity amplifier and a data latch circuit; the said sensitivity amplifier comprises the $1^{st}$, the $2^{nd}$, the $3^{rd}$, the $4^{th}$, the $5^{th}$, the $6^{th}$ and the $7^{th}$ PMOS tubes and the $1^{st}$, the $2^{nd}$, the $3^{rd}$, the $4^{th}$ and the $5^{th}$ NMOS tubes; source of the $1^{st}$ PMOS tube, the $4^{th}$ PMOS tube and the $5^{th}$ PMOS tube is connected to the power supply respectively; drain of the $1^{st}$ PMOS tube and source of the $2^{nd}$ PMOS tube are connected to the source of the $3^{rd}$ PMOS tube; drain of the $2^{nd}$ PMOS tube, grid of the $3^{rd}$ PMOS tube, drain of the $4^{th}$ PMOS tube, drain of the $6^{th}$ PMOS tube, drain of the $1^{st}$ NMOS tube and grid of the $2^{nd}$ NMOS tube are connected to the drain of the $4^{th}$ NMOS tube respectively, and the connecting terminal is the $1^{st}$ output terminal of the said sensitivity amplifier; grid of the $2^{nd}$ PMOS tube, drain of the $3^{rd}$ PMOS tube, drain of the $5^{th}$ PMOS tube, drain of the $7^{th}$ PMOS tube, grid of the $1^{st}$ NMOS tube and drain of the $2^{nd}$ NMOS tube are connected to the drain of the $5^{th}$ NMOS tube respectively, and the connecting terminal is the $2^{nd}$ input terminal of the said sensitivity amplifier; grid of the $1^{st}$ PMOS tube and the $4^{th}$ NMOS tube is connected to the grid of the $5^{th}$ NMOS tube, and the connecting terminal is the SADIS terminal of the said sensitivity amplifier; SADIS terminal of the said sensitivity amplifier is used to couple discharging signals to sensitivity amplifier; grid of the $4^{th}$ PMOS tube is connected to the grid of the $5^{th}$ PMOS tube, and the connecting terminal is SAPRE terminal of the said sensitivity amplifier; SAPRE terminal of the said sensitivity amplifier is used to couple charging signals to the sensitivity amplifier; grid of the $6^{th}$) PMOS tube is connected to the grid of the $7^{th}$ PMOS tube, and the connecting terminal is SASEL terminal of the said sensitivity amplifier; SASEL terminal of the said sensitivity amplifier is used to couple read signals to the sensitivity amplifier; grid of the $3^{rd}$ NMOS tube serves as SAE terminal of the said sensitivity amplifier; SAE terminal of the said sensitivity amplifier is used to couple enabling signals to the sensitivity amplifier; source of the $1^{st}$ NMOS tube and the NMOS tube is connected to the drain of the $3^{rd}$ NMOS tube respectively; source of the $3^{rd}$ NMOS tube, the $4^{th}$ NMOS tube and the $5^{th}$ NMOS tube is grounded respectively; source of the $6^{th}$ PMOS tube serves as the $1^{st}$ signal input terminal of the said sensitivity amplifier; source of the $7^{th}$ PMOS tube serves as the $2^{nd}$ signal input terminal of the said sensitivity amplifier; the $1^{st}$ signal input terminal of the said sensitivity amplifier serves as BL terminal of the output circuit of the said static RAM; the $2^{nd}$ signal input terminal of the said sensitivity amplifier serves as BLB terminal of the output circuit of the said static RAM; BL terminal and BLB terminal of the output circuit of the said static RAM are used to connect the data selector to receive bit-line pairs.

The said data latch circuit comprises two NOR gates, the $8^{th}$ PMOS tube, the $9^{th}$ PMOS tube, the $10^{th}$ PMOS tube, the $11^{th}$ PMOS tube, the $6^{th}$ NMOS tube, the $7^{th}$ NMOS tube, the $8^{th}$ NMOS tube, the $9^{th}$ NMOS tube and the $10^{th}$ NMOS tube; the said NOR gate is provided with the $1^{st}$ input terminal, the $2^{nd}$ input terminal and the output terminal; the said two NOR gates comprise the $1^{st}$ NOR gate and the $2^{nd}$ NOR gate; source of the $9^{th}$ PMOS tube and grid of the $6^{th}$ NMOS tube are connected to the power supply; the $1^{st}$ input terminal of the $1^{st}$ NOR gate serves as the $1^{st}$ input terminal of the said data latch circuit; the $1^{st}$ input terminal of the said data latch circuit is connected to the $1^{st}$ output terminal of the said sensitivity amplifier; the $2^{nd}$ input terminal of the $1^{st}$ NOR gate, output terminal of the $2^{nd}$ NOR gate and grid of the $10^{th}$ PMOS tube are connected to the grid of the $10^{th}$ NMOS tube; output terminal of the $1^{st}$ NOR gate, the $1^{st}$ input terminal of the $2^{nd}$ NOR gate, source of the $6^{th}$ NMOS tube, source of the $11^{th}$ PMOS tube and grid of the $8^{th}$ PMOS tube are connected to the grid of the $9^{th}$ NMOS tube; the $2^{nd}$ input terminal of the $2^{nd}$ NOR gate serves as the $2^{nd}$ input terminal of the said data latch circuit; the $2^{nd}$ input terminal of the said data latch circuit is connected to the $2^{nd}$ input terminal of the said sensitivity amplifier; drain of the $9^{th}$ PMOS tube is connected to the source of the $8^{th}$ PMOS tube;

grid of the $9^{th}$ PMOS tube is connected to the grid of the $7^{th}$ NMOS tube, and the connecting terminal is OUTDIS terminal of the said data latch circuit; OUTDIS terminal of the said data latch circuit is used to receive discharging control signals from the output terminal; source of the $10^{th}$ PMOS tube, drain of the $10^{th}$ PMOS tube, drain of the $10^{th}$ NMOS tube, source of the $10^{th}$ NMOS tube, source of the $8^{th}$ NMOS tube, source of the $9^{th}$ NMOS tube, source of the 7th NMOS tube and grid of the $11^{th}$ PMOS tube are grounded; drain of the $6^{th}$ NMOS tube and drain of the $11^{th}$ PMOS tube are connected to the grid of the $8^{th}$ NMOS tube; drain of the $8^{th}$ PMOS tube, drain of the $8^{th}$ NMOS tube and drain of the $9^{th}$ NMOS tube are connected to the drain of the $7^{th}$ NMOS tube, and the connecting terminal is the output terminal of the said data latch circuit; output terminal of the said data latch circuit serves as the output terminal of the output circuit of the said static RAM.

The said input circuit comprises the $11^{th}$ NMOS tube, the $12^{th}$ NMOS tube, the $13^{th}$ NMOS tube, the $14^{th}$ NMOS tube, the $15^{th}$ NMOS tube, the $16^{th}$ NMOS tube, the $17^{th}$ NMOS tube, the $18^{th}$ NMOS tube, the 19NMOS tube, the $20^{th}$ NMOS tube, the $21^{st}$ NMOS tube, the $12^{th}$ PMOS tube, the $13^{th}$ PMOS tube, the $14^{th}$ PMOS tube, the $15^{th}$ PMOS tube, the $16^{th}$ PMOS tube, the $17^{th}$ PMOS tube, the $18^{th}$ PMOS tube, the $19^{th}$ PMOS tube, the $20^{th}$ PMOS tube, the $21^{st}$ PMOS tube, the $22^{nd}$ PMOS tube, the $23^{rd}$ PMOS tube and the $24^{th}$ PMOS tube; source of the $12^{th}$ PMOS tube, the $14^{th}$ PMOS tube, the $16^{th}$ PMOS tube, the $17^{th}$ PMOD tube, the $18^{th}$ PMOS tube, the $20^{th}$ PMOS tube, the $22^{nd}$ PMOS tube, the $23^{rd}$ PMOS tube and the $24^{th}$ PMOS tube is connected to the power supply respectively; drain of the $12^{th}$ PMOS tube is connected to the source of the $13^{th}$ PMOS tube; drain of the $13^{th}$ PMOS tube, the $11^{th}$ NMOS tube, the $15^{th}$ PMOS tube and the $13^{th}$ NMOS tube and grid of the $16^{th}$ PMOS tube are connected to the grid of the $15^{th}$ NMOS tube; source of the $11^{th}$ NMOS tube is connected to the drain of the $12^{th}$ NMOS tube; source of the $12^{th}$ NMOS tube, the $14^{th}$ NMOS tube, the $15^{th}$ NMOS tube, the $16^{th}$ NMOS tube, the $17^{th}$ NMOS tube, the $19^{th}$ NMOS tube and the $21^{st}$ NMOS tube is grounded respectively; drain of the $14^{th}$ PMOS tube is connected to the source of the $15^{th}$ PMOS tube; source of the $13^{th}$ NMOS tube is connected to the drain of the $14^{th}$ NMOS tube; grid of the $14^{th}$ PMOS and the $14^{th}$ NMOS tube, drain of the $15^{th}$ NMOS tube and the $16^{th}$ PMOS tube and grid of the $17^{th}$ PMOS tube, $16^{th}$ NMOS tube and $19^{th}$ NMOS tube are connected to the grid of the $20^{th}$ PMOS tube; drain of the $17^{th}$ PMOS tube and the $16^{th}$ NMOS tube and grid of the $17^{th}$ NMOS tube are connected to the grid of the $18^{th}$ PMOS tube; drain of the $17^{th}$ NMOS tube and the $18^{th}$ PMOS tube and source of the $18^{th}$ NMOS tube are connected to the source of the $19^{th}$ PMOS tube; drain of the $18^{th}$ NMOS tube and the $19^{th}$ PMOS tube is connected to the drain of the $22^{nd}$ PMOS tube, and the connecting terminal is the $1^{st}$ output terminal of the said input circuit; drain of the $19^{th}$ NMOS tube and the $20^{th}$ PMOS tube and source of the $20^{th}$ NMOS tube are connected to the source of the $21^{st}$ PMOS tube; drain of the $20^{th}$ NMOS tube and the $21^{st}$ PMOS tube is connected to the drain of the $23^{rd}$ PMOS tube, and the connecting terminal is the $2^{nd}$ output terminal of the said input circuit; grid of the $12^{th}$ PMOS tube, the $18^{th}$ NMOS tube, the $20^{th}$ NMOS tube, the $13^{th}$ NMOS tube and the $21^{st}$ NMOS tube is connected to the grid of the $24^{th}$ PMOS tube, and the connecting terminal is the clock signal input terminal of the said input circuit, used to receive write-in signals output from the said clock circuit; grid of the $12^{th}$ NMOS tube and the $15^{th}$ PMOS tube, drain of the $24^{th}$ PMOS tube and the $21^{st}$ NMOS tube and grid of the $19^{th}$ PMOS tube are connected to the grid of the $21^{st}$ PMOS tube, and the connecting terminal is the inverted clock signal input terminal of the said input circuit, used to receive inverted signals among write-in signals output from the said clock module; grid of the $13^{th}$ PMOS tube is connected to the grid of the $11^{th}$ NMOS tube, and the connecting terminal is the signal input terminal of the said input circuit, used to receive external data; grid of the $22^{nd}$ PMOS tube is connected to the grid of the $23^{rd}$ PMOS tube, and the connecting terminal is the charging signal input terminal of the said input circuit, used to receive charging signals output from the said clock circuit. The circuit aims to make use of the $14^{th}$ PMOS tube, the $15^{th}$ PMOS tube, the $12^{th}$ NMOS tube and the $14^{th}$ NMOS tube to guard against the impact of leakage current, maintain the voltage to the grid of the $15^{th}$ NMOS tube and the $16^{th}$ PMOS tube, improve data input precision, and reduce the leakage current based on functions of the input circuit as realized.

As compared with prior art, the present invention has the following advantages: It can ensure basically identical power consumption in each working cycle in case of data reading, which is provided with higher capability in Differential Power Analysis Resistance; as compared with existing static RAMs, it can improve power consumption equilibrium by 53% for effective defense of differential energy attack.

DESCRIPTION OF EMBODIMENTS

Figure 1:
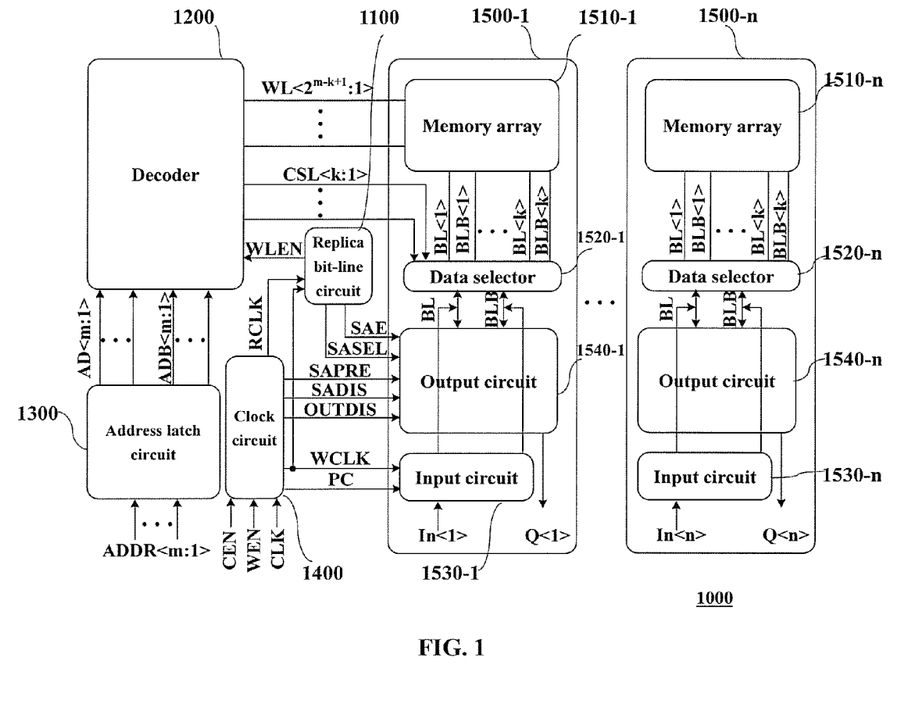
FIG. 1 is the structural block diagram for the present invention.
Figure 2:
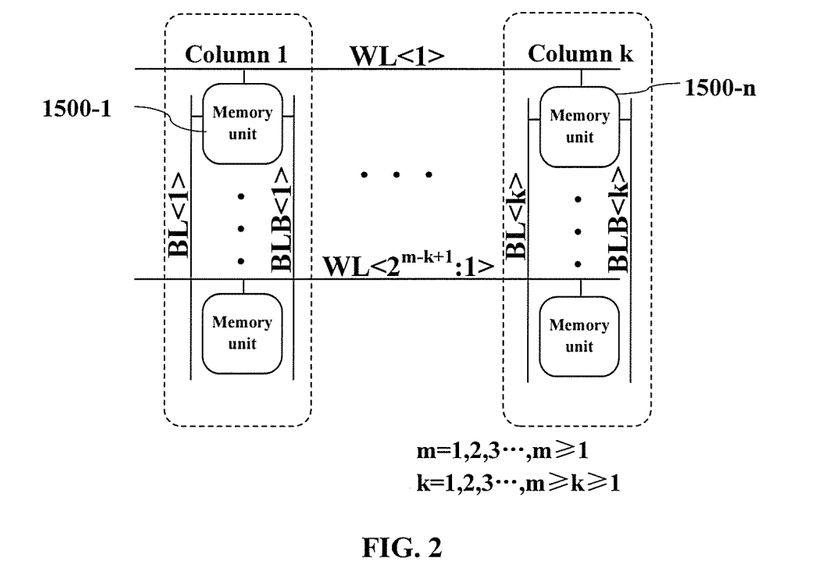
FIG. 2 is the structural block diagram for the memory array of the present invention.
Figure 3:
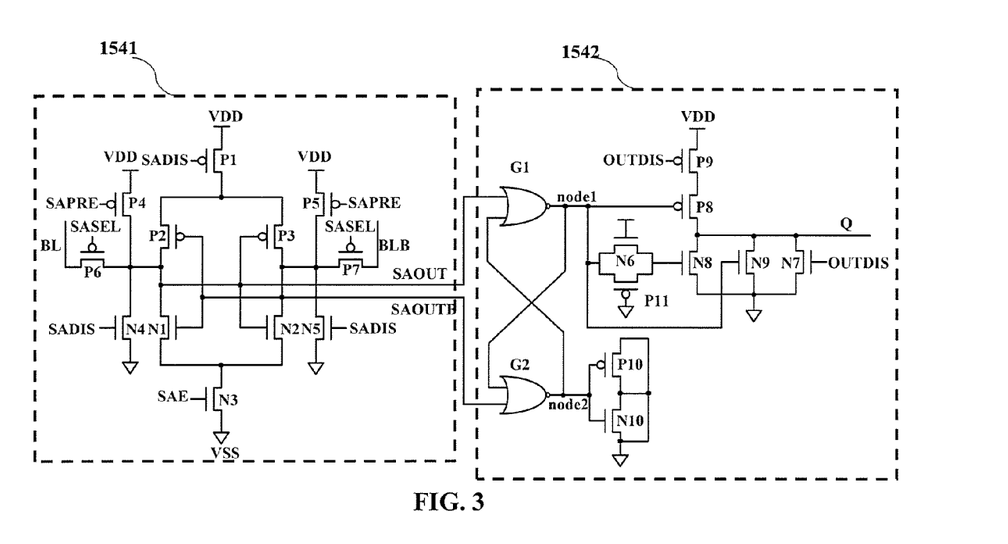
FIG. 3 is the circuit diagram for the output circuit of the present invention.

The present invention is further described as follows in combination with drawings and embodiments:

Embodiment A: shown in FIGS. 1, 2 and 3, a static RAM for Differential Power Analysis Resistance 1000, comprising a replica bit-line circuit 1100, a decoder 1200, an address data latch circuit 1300, a clock circuit 1400, n-bit memory arrays 1510-1-1510-n, n-bit data selectors 1520-1-1520-n, n-bit input circuits 1530-1-1530-n and n-bit output circuits 1540-1 thru 1540-n, where n is an integral equal to or over 1. The said decoder 1200 is connected to the said replica bit-line circuit 1100, the said address data latch circuit 1300, the said n-bit memory arrays 1510-1-1510-n and the said n-bit data selectors 1520-1-1520-n, respectively. The said clock circuit 1400 is connected to the said replica bit-line circuit 1100, the said n-bit input circuits 1530-1-1530-n, the said n-bit output circuits 1540-1-1540-n, respectively. The said input circuit j is connected to the said data selector j; the said replica bit-line circuit is connected to the said n-bit output circuits 1540-1-1540-n. The said data selector j is connected to the said memory array j and the said output circuit j, respectively, where j=1, 2, . . . , n. With reference to FIG. 2, array of memory units 1500-1-1500-n are illustrated.

With reference to FIG. 3, the said output circuit 1540 comprises a sensitivity amplifier 1541 and a data latch circuit 1542. The said sensitivity amplifier 1541 comprises a $1^{st}$ PMOS tube P1, a $2^{nd}$ PMOS tube P2, a $3^{rd}$ PMOS tube P3, a $4^{th}$ PMOS tube P4, a $5^{th}$) PMOS tube P5, a $6^{th}$ PMOS tube P6, a $7^{th}$ PMOS tube P7 and a $1^{st}$ NMOS tube N1, a $2^{nd}$ NMOS tube N2, a $3^{rd}$ NMOS tube N3, a $4^{th}$ NMOS tube N4 a $5^{th}$ NMOS tube N5. In detail, a source of the $1^{st}$ PMOS tube P1, a source of the $4^{th}$ PMOS tube P4 and a source of the $5^{th}$ PMOS tube P5 are connected to the power supply VDD, respectively. A drain of the $1^{st}$ PMOS tube P1 and a source of the $2^{nd}$ PMOS tube P2 are connected to the source of the $3^{rd}$ PMOS tube P3. A drain of the $2^{nd}$ PMOS tube P2, a grid of the $3^{rd}$ PMOS tube P3, a drain of the $4^{th}$ PMOS tube P4, a drain of the $6^{th}$ PMOS tube P6, a drain of the $1^{st}$ NMOS tube N1 and a grid of the $2^{nd}$ NMOS tube N2 are connected to a drain of the $4^{th}$ NMOS tube N4, respectively, and a common connection thereof is the $1^{st}$ output terminal SAOUT of the said sensitivity amplifier 1541. A grid of the $2^{nd}$ PMOS tube P2, a drain of the $3^{rd}$ PMOS tube P3, a drain of the $5^{th}$ PMOS tube P5, a drain of the $7^{th}$ PMOS tube P7, a grid of the $1^{st}$ NMOS tube N1 and a drain of the $2^{nd}$ NMOS tube N2 are connected to a drain of the $5^{th}$ NMOS tube N5 respectively, and a common connection thereof is the $2^{nd}$ input terminal SAOUTB of the said sensitivity amplifier 1541. A grid of the $1^{st}$ PMOS tube P1 and a grid of the $4^{th}$ NMOS tube N4 are connected to a grid of the $5^{th}$ NMOS tube N5, and a common connection thereof is a SADIS terminal of the said sensitivity amplifier 1541. The SADIS terminal of the said sensitivity amplifier 1541 is used to couple discharging signals to sensitivity amplifier 1541. A grid of the $4^{th}$ PMOS tube P4 is connected to a grid of the $5^{th}$ PMOS tube, and a common connection thereof is a SAPRE terminal of the said sensitivity amplifier 1541, and the SAPRE terminal of the said sensitivity amplifier 1541 is used to couple charging signals to the sensitivity amplifier 1541. A grid of the $6^{th}$ PMOS tube P6 is connected to a grid of the $7^{th}$ PMOS tube P7, and a common connection thereof is a SASEL tell iinal of the said sensitivity amplifier 1541. The SASEL terminal of the said sensitivity amplifier 1541 is used to couple read signals to the sensitivity amplifier 1541. A grid of the $3^{rd}$ NMOS tube N3 serves as a SAE terminal of the said sensitivity amplifier 1541. The SAE terminal of the said sensitivity amplifier 1541 is used to couple enabling signals to the sensitivity amplifier 1541. A source of the $1^{st}$ NMOS tube N1 and a source of the $2^{nd}$ NMOS tube N2 are connected to a drain of the $3^{rd}$ NMOS tube N3 respectively. A source of the $3^{rd}$ NMOS tube N3, a source of the $4^{th}$ NMOS tube N4 and a source of the $5^{th}$ NMOS tube N5 are grounded VSS, respectively. A source of the $6^{th}$ PMOS tube P6 serves as a $1^{st}$ signal input terminal of the said sensitivity amplifier 1541. A source of the $7^{th}$ PMOS tube P7 serves as a $2^{nd}$ signal input terminal of the said sensitivity amplifier 1541. The $1^{st}$ signal input terminal of the said sensitivity amplifier 1541 serves as BL terminal of the output circuit of the said static RAM. The $2^{nd}$ signal input terminal of the said sensitivity amplifier 1541 serves as BLB terminal of the output circuit of the said static RAM. The BL terminal and the BLB terminal of the output circuit of the said static RAM are used to connect the data selector to receive bit-line pairs.

The said data latch circuit 1542 comprises two NOR gates G1, G2, a $8^{th}$ PMOS tube P8, a $9^{th}$ PMOS tube P9, a $10^{th}$ PMOS tube P10, a $11^{th}$ PMOS tube P11, a $6^{th}$ NMOS tube N6, a $7^{th}$ NMOS tube N7, a $8^{th}$ NMOS tube N8, a $9^{th}$ NMOS tube N9 and a $10^{th}$ NMOS tube N10. In detail, each of the said NOR gates is provided with the $1^{st}$ input terminal, the $2^{nd}$ input terminal and the output terminal. The said two NOR gates comprise the $1^{st}$ NOR gate G1 and the $2^{nd}$ NOR gate G2. A source of the $9^{th}$ PMOS tube P9 and a grid of the $6^{th}$ NMOS tube N6 are connected to the power supply. A $1^{st}$ input terminal of the 1st NOR gate G1 serves as a $1^{st}$ input terminal of the said data latch circuit. The $1^{st}$ input terminal of the said data latch circuit 1542 is connected to the $1^{st}$ output terminal of the said sensitivity amplifier 1541. A $2^{nd}$ input terminal of the $1^{st}$ NOR gate G1, an output terminal of the $2^{nd}$ NOR gate G2 and a grid of the $10^{th}$ PMOS tube P10 are connected to a grid of the $10^{th}$ NMOS tube N10, and a common connection thereof is marked as node 2. An output terminal of the $1^{st}$ NOR gate G1, a $1^{st}$ input terminal of the $2^{nd}$ NOR gate G2, a source of the $6^{th}$ NMOS tube N6, a source of the $11^{th}$ PMOS tube P11 and a grid of the $8^{th}$ PMOS tube P8 are connected to a grid of the $9^{th}$ NMOS tube N9, and a common connection thereof is marked as node 1. A $2^{nd}$ input terminal of the $2^{nd}$ NOR gate serves as a $2^{nd}$ input terminal of the said data latch circuit 1542. The $2^{nd}$ input terminal of the said data latch circuit 1542 is connected to the $2^{nd}$ input terminal of the said sensitivity amplifier 1541. The drain of the $9^{th}$ PMOS tube P9 is connected to the source of the $8^{th}$ PMOS tube P8. The grid of the $9^{th}$ PMOS tube P9 is connected to the grid of the $7^{th}$ NMOS tube N7, and a common connection thereof is OUTDIS terminal of the said data latch circuit 1542. The OUTDIS terminal of the said data latch circuit 1542 is used to receive discharging control signals from the output terminal Q of the data latch circuit 1542. A source of the $10^{th}$ PMOS tube P10, a drain of the $10^{th}$ PMOS tube P10, a drain of the $10^{th}$ NMOS tube N10, the source of the $10^{th}$ NMOS tube N10, a source of the $8^{th}$ NMOS tube N8, a source of the $9^{th}$ NMOS tube N9, a source of the $7^{th}$ NMOS tube N7 and a grid of the $11^{th}$ PMOS tube P11 are grounded. A drain of the $6^{th}$ NMOS tube N6 and a drain of the $11^{th}$ PMOS tube P11 are connected to a grid of the $8^{th}$ NMOS tube N8. A drain of the $8^{th}$ PMOS tube P8, a drain of the $8^{th}$ NMOS tube N8 and a drain of the $9^{th}$ NMOS tube N9 are connected to a drain of the $7^{th}$ NMOS tube N7, and a common connection thereof is the output terminal of the said data latch circuit 1542. The output terminal of the said data latch circuit 1542 serves as the output terminal Q of the output circuit of the said static RAM.

Figure 9:
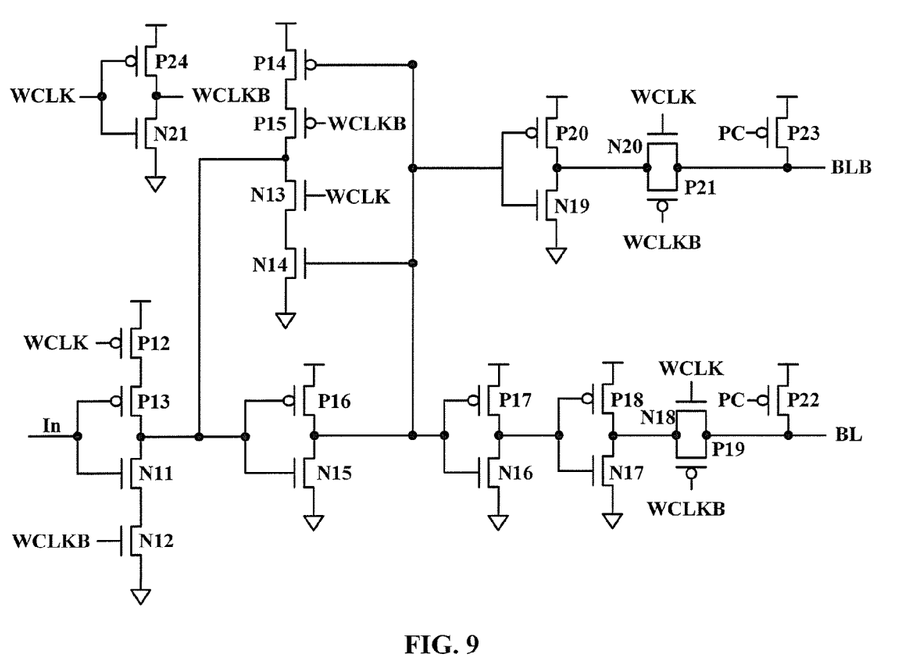
FIG. 9 is the input circuit of the static RAM in Embodiment 2.

As shown in FIG. 9, the said input circuit comprises a $11^{th}$ NMOS tube N11, a $12^{th}$ NMOS tube N12, a $13^{th}$ NMOS tube N13, a $14^{th}$ NMOS tube N14, a $15^{th}$ NMOS tube N15, a $16^{th}$ NMOS tube N16, a $17^{t1}$ NMOS tube N17, a $18^{th}$ NMOS tube N18, a $19^{th}$ NMOS tube N19, a $20^{th}$ NMOS tube N20, a $21^{st}$ NMOS tube N21, a $12^{th}$ PMOS tube P12, a $13^{th}$ PMOS tube P13, a $14^{th}$ PMOS tube P14, a $15^{th}$ PMOS tube P15, a $16^{th}$ PMOS tube P16, a $17^{th}$ PMOS tube P17, a $18^{th}$ PMOS tube P18, a $19^{th}$ PMOS tube P19, a $20^{th}$ PMOS tube P20, a $21^{st}$ PMOS tube P21, a $22^{nd}$ PMOS tube P22, a $23^{rd}$ PMOS tube P23 and a $24^{th}$ PMOS tube P24.

In detail, a source of the $12^{th}$ PMOS tube P12, the $14^{th}$ PMOS tube P14, the $16^{th}$ PMOS tube P16, the $17^{th}$ PMOD tube P17, the $18^{th}$ PMOS tube P18, the $20^{th}$ PMOS tube P20, the $22^{nd}$ PMOS tube P22, the $23^{rd}$ PMOS tube P23 and the $24^{th}$ PMOS tube P24 is connected to the power supply respectively. A drain of the 12$^{th}$ PMOS tube P12 is connected to a source of the 13$^{th}$ PMOS tube P13. A drain of the 13$^{th}$ PMOS tube P13, a drain of the 11$^{th}$ NMOS tube N11, a drain of the 15$^{th}$ PMOS tube P15, a drain of the 13$^{th}$ NMOS tube N13 and a grid of the 16$^{th}$ PMOS tube P16 are connected to a grid of the 15$^{th}$ NMOS tube N15. A source of the 11$^{th}$ NMOS tube N11 is connected to a drain of the 12$^{th}$ NMOS tube N12. A source of the 12$^{th}$ NMOS tube N12, a source of the 14$^{th}$ NMOS tube N14, a source of the 15$^{th}$ NMOS tube N15, a source of the 19$^{th}$ NMOS tube N19 and a source of the 21$^{st}$ NMOS tube N21 are grounded respectively. A drain of the 14$^{th}$ PMOS tube P14 is connected to the source of the 15$^{th}$ PMOS tube P15. A source of the 13$^{th}$ NMOS tube N13 is connected to a drain of the 14$^{th}$ NMOS tube N14. A grid of the 14$^{th}$ PMOS tube P14 and a grid of the 14$^{th}$ NMOS tube N14, a drain of the 15$^{th}$ NMOS tube N15, a drain of the 16$^{th}$ PMOS tube P16, a grid of the 17$^{th}$ PMOS tube P17, a grid of the 16$^{th}$ NMOS tube N16 and a grid of the 19$^{th}$ NMOS tube N19 are connected to a grid of the 20$^{th}$ PMOS tube P20. A drain of the 17$^{th}$ PMOS tube P17, a drain of the 16$^{th}$ NMOS tube N16 and a grid of the 17$^{th}$ NMOS tube N17 are connected to a grid of the 18$^{th}$ PMOS tube P18. A drain of the 17$^{th}$ NMOS tube N17, a drain of the 18$^{th}$ PMOS tube P18 and a source of the 18$^{th}$ NMOS tube N18 are connected to a source of the 19$^{th}$ PMOS tube P19. A drain of the 18$^{th}$ NMOS tube N18 and a drain of the 19$^{th}$ PMOS tube P19 are connected to the drain of the 22$^{nd}$ PMOS tube P22, and a common connection thereof is the 1$^{st}$ output terminal of the said input circuit. A drain of the 19$^{th}$ NMOS tube N19, a drain of the 20$^{th}$ PMOS tube P20 and a source of the 20$^{th}$ NMOS tube N20 are connected to a source of the 21$^{st}$ PMOS tube P21. A drain of the 20$^{th}$ NMOS tube N20 and a drain of the 21$^{st}$ PMOS tube P21 are connected to the drain of the 23$^{rd}$ PMOS tube P23, and a common connection thereof is the 2$^{nd}$ output terminal of the said input circuit. A grid of the 12$^{th}$ PMOS tube P12, a grid of the 18$^{th}$ NMOS tube N18, a grid of the 20$^{th}$ NMOS tube N20, a grid of the 13$^{th}$ NMOS tube N13 and a grid of the 21$^{st}$ NMOS tube N21 are connected to a grid of the 24$^{th}$ PMOS tube P24, and a common connection thereof is a clock signal input terminal WCLK of the said input circuit, used to receive write-in signals output from the said clock circuit. A grid of the 12$^{th}$ NMOS tube N12, a grid of the 15$^{th}$ PMOS tube P15, a drain of the 24$^{th}$ PMOS tube P24, a drain of the 21$^{st}$ NMOS tube N21 and a grid of the 19$^{th}$ PMOS tube P19 are connected to a grid of the 21$^{st}$ PMOS tube P21, and a common connection thereof is the inverted clock signal input terminal WCLKB of the said input circuit, used to receive inverted signals among write-in signals output from the said clock module. A grid of the 13$^{th}$ PMOS tube P13 is connected to a grid of the 11$^{th}$ NMOS tube N11, and a common connection thereof is the signal input terminal In of the said input circuit, used to receive external data. A grid of the 22$^{nd}$ PMOS tube P22 is connected to a grid of the 23$^{rd}$ PMOS tube P23, and a common connection thereof is the charging signal input terminal PC of the said input circuit, used to receive charging signals output from the said clock circuit.

Figure 4:
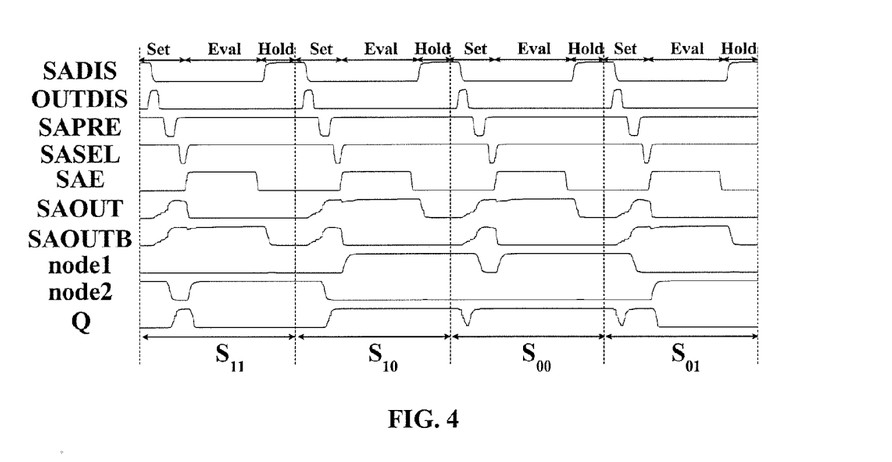
FIG. 4 is the timing diagram for the output circuit of the present invention.

In this embodiment, the replica bit-line circuit 1100, the decoder 1200, the address latch circuit 1300, the clock circuit 1400, the memory array 1510-1-1510-n, the data selector 1520-1-1520-n and the input circuit 1540-1-1540-n are well-established products in the technical field. The SADIS, SAPRE, SASEL and SAE terminals of the sensitivity amplifier 1541 as well as OUTDIS terminal of the data latch circuit 1542 are connected to the clock circuit respectively. The terminal BL and BLB of the output circuit of the static RAM are connected to the data selector. Timing diagram for the output circuit of the static RAM of the present invention is as shown in FIG. 4. According to read data outputted from the output circuit in previous and current stages, four working states $S_{00}$, $S_{01}$, $S_{10}$, $S_{11}$ can be categorized, the working states $S_{00}$ represents that logic 0 is read for the previous stage and logic 0 for the current stage; the working states $S_{01}$ represents that logic 0 is read for the previous stage and logic 1 for the current stage; the working states $S_{10}$ represents that logic 1 is read for the previous stage and logic 0 for the current stage; and the working states $S_{11}$ represents that logic 1 is read for the previous stage and logic 1 for the current stage. As shown in FIG. 4, output terminal Q may subject to one-time charging before the evaluation stage. It is to be maintained or discharged according to the reading data at the evaluation stage. The node 1 and node 2 may charge and discharge one of nodes in each cycle. The 1$^{st}$ output terminal SAOUT and the 2$^{nd}$ output terminal SAOUTB of the sensitivity amplifier 1541 may experience one-time charging and discharging in each cycle to ensure balanced power consumption.

Every cycle of the working process of the output circuit of the static RAM of the present invention includes five stages, namely a discharging stage, a charging stage, a read-in stage, an evaluation stage and a maintaining stage in turn. Before the cycle begins, a SADIS terminal of the sensitivity amplifier, a SAPRE terminal of the sensitivity amplifier and a SASEL terminal of the sensitivity amplifier are all kept at a high level, the first output terminal SAOUT and the second output terminal SAOUTB of the sensitivity amplifier both discharge to VSS, the data latch circuit is kept in the data maintaining status; an SAE terminal of the sensitivity amplifier and an OUTDIS terminal of the data latch circuit are kept at a low level, and the output terminal Q maintains the original level unchanged.

Discharging stage: The OUTDIS terminal of the data latch circuit is charged to a high level, the 9th PMOS tube P9 in the drop-up passage of the output terminal Q is switched off, the 7th NMOS tube N7 in the drop-down passage is switched on, the output terminal Q is discharged by the 7th NMOS tube N7 to VSS, and the remaining nodes remain unchanged.

Charging stage: The SAPRE terminal, the SADIS terminal and the OUTDIS terminal are discharged to a low level, the 4th PMOS tube P4, the 5th PMOS tube P5 and the 9th PMOS tube P9 are switched on, while the 4th NMOS tube N4, the 5th NMOS tube N5 and the 7th NMOS tube N7 are switched off. The first output terminal SAOUT and the second output terminal SAOUTB of the sensitivity amplifier are charged to VDD by the 4th PMOS tube P4 and the 5th PMOS tube P5; the RS trigger (comprised of the first NOR gate G1 and the second NOR gate G2) of the data latch circuit is controlled by the first output terminal SAOUT and the second output terminal SAOUTB of the sensitivity amplifier; node 1 and node 2 are discharged to VSS by the first NOR gate G1 and the second NOR gate G2; and the output terminal Q is charged to VDD by the 8th PMOS tube P8 and the 9th PMOS tube P9.

Read-in stage: The SASEL terminal is discharged to a low level; the SAPRE terminal is charged to a high level and the 6th PMOS tube P6 and the 7th PMOS tube P7 are switched on; the 4th PMOS tube P4 and the 5th PMOS tube P5 are switched off. The BL terminal of the output circuit of the static RAM and the BLB of the output circuit of the static RAM transmit the voltage difference to the first output terminal SAOUT and the second output terminal SAOUTB of the sensitivity amplifier through the 6th PMOS tube P6 and the 7th PMOS tube P7.

Evaluation stage: A SAESEL terminal and the SAE terminal are charged to a high level; the 6th PMOS tube P6 and the 7th PMOS tube P7 are switched off, and the 3rd NMOS tube N3 is switched on. The sensitivity amplifier amplifies the voltage difference of the first output terminal SAOUT and the second output terminal SAOUTB of the sensitivity amplifier through positive feedback; according to the received voltage difference, either the first output terminal SAOUT or the second output terminal SAOUTB of the sensitivity amplifier is charged to VDD, and the other is discharged to VSS; the RS trigger charges/discharges node 1 and node 2 according to the first output terminal SAOUT and the second output terminal SAOUTB of the sensitivity amplifier; and according to the level status of node 1, the output terminal Q is charged/discharged by the 8th PMOS tube P8, the 8th NOMOS tube N8, the 9th PMOS tube P9 and the 9th NMOS tube N9.

Maintaining stage: The SAE terminal is discharged to a low level; the SADIS terminal is charged to a high level; the 3rd NMOS tube N3 is switched off; and the 4th NMOS tube N4 and the 5th NMOS tube N5 are switched on. The first output terminal SAOUT and the second output terminal SAOUTB of the sensitivity amplifier are discharged to VSS through the 4th NMOS tube N4 and the 5th NMOS tube N5, and a data output maintaining circuit enters its maintaining status.

Figure 5:
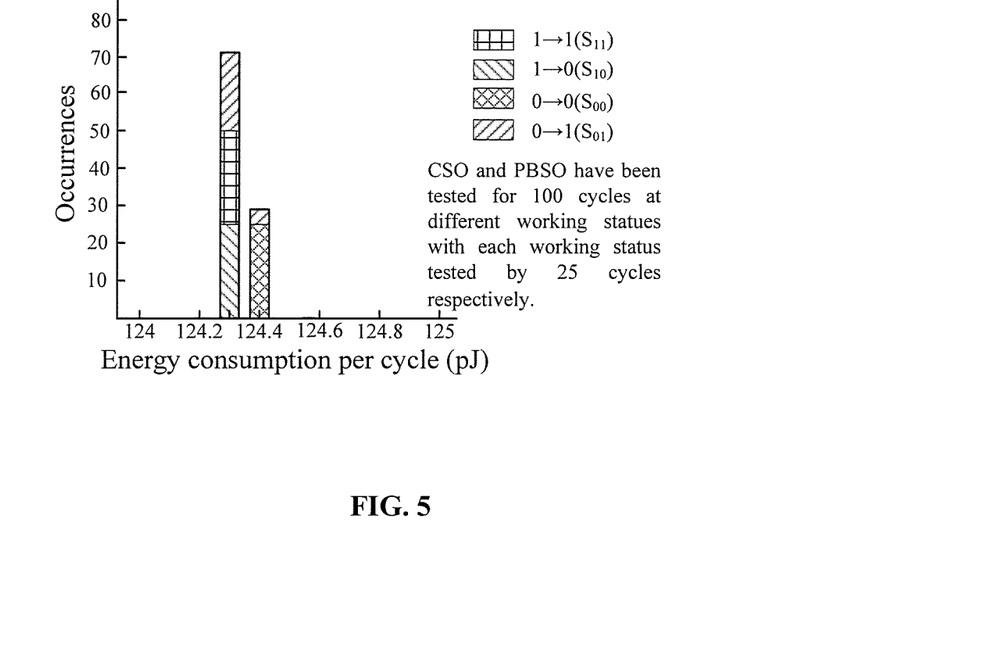
FIG. 5 is the energy consumption distribution diagram for the output circuit of the present invention.
Figure 6:
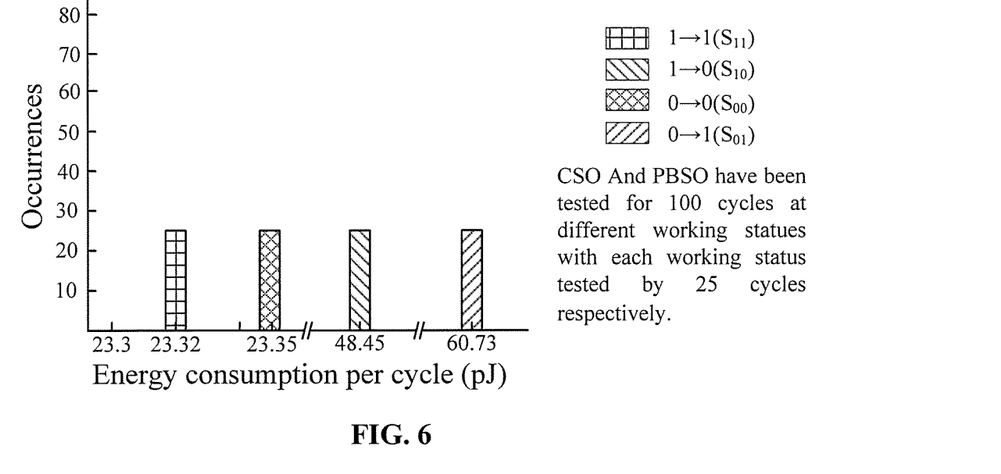
FIG. 6 is the energy consumption distribution diagram for existing output circuit.
Figure 7:
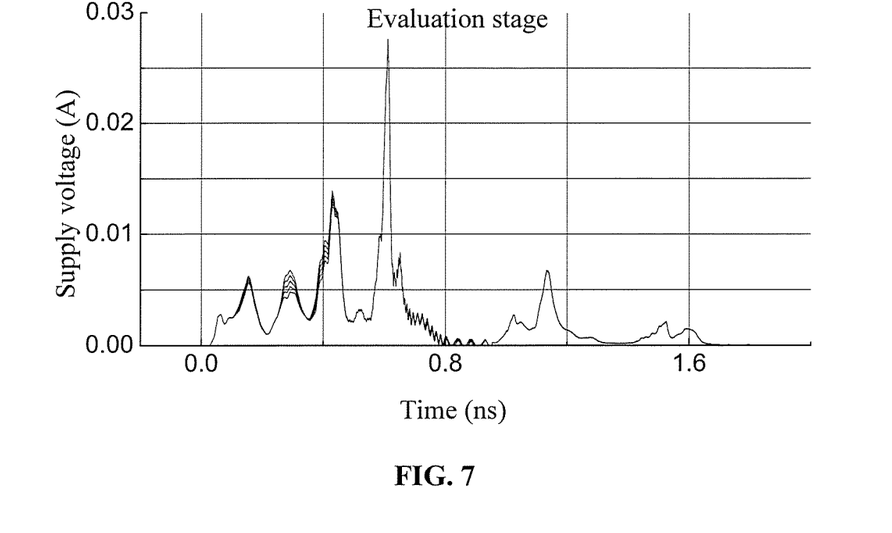
FIG. 7 is the diagram showing superposition of supply current produced by reading of 100 groups of data by the present invention.
Figure 8:
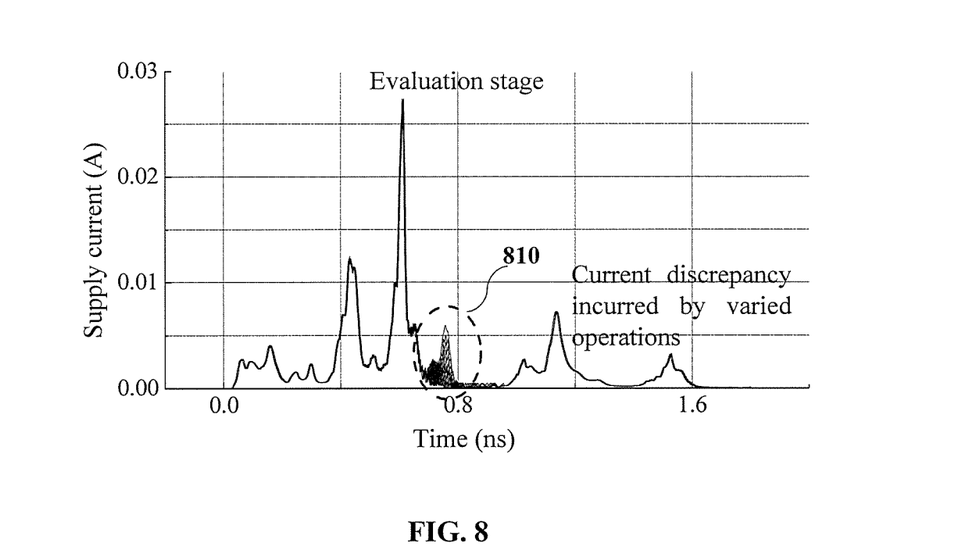
FIG. 8 is the diagram showing superposition of supply voltage produced by reading of 100 groups of data by existing static RAM.

Energy consumption distribution diagram for the output circuit of the static RAM of the present invention is as shown in FIG. 5. The energy consumption distribution diagram for output circuit of existing static RAM is as shown in FIG. 6. According to the analysis of FIG. 6, the output circuit of the present invention has eliminated the difference between switching and short-circuit power consumption, which ensuring basically identical power consumption at each working state in each cycle. According to analysis of FIG. 6, output circuit of existing static RAM may produce obvious discrepancy to the power consumption at different working states. The output circuit of existing static RAM is requested to alter the data as stored in the data latch circuit 1542 to produce corresponding switching and short-circuit power consumption at working state $S_{01}$ and $S_{10}$. As a result of it, power consumption at working state $S_{01}$ and $S_{10}$ is obviously higher than that at working state $S_{11}$ and $S_{00}$. FIG. 7 is the diagram showing superposition of supply current produced by the static RAM for Differential Power Analysis Resistance when reading 100 groups of data. FIG. 8 is the diagram showing superposition of supply current produced by existing static RAM when reading 100 groups of data. According to analysis of FIGS. 7 and 8, existing static RAM has obvious current discrepancy at the evaluation stage, for example a circled area 810 shown in FIG. 8. On the contrary, the present invention has overcome defects associated with power consumption and data reading, which can ensure consistent power consumption and current in each reading cycle. As compared with prior art, the present invention has effectively improved the power equilibrium by 53%, which can effectively minimize differential power analysis attack.

The invention claimed is:
1. A static RAM for Differential Power Analysis Resistance, comprising:
   a replica bit-line circuit;
   a decoder;
   an address data latch circuit;
   a clock circuit;
   n-bit memory arrays;
   n-bit data selectors;
   n-bit input circuits; and
   n-bit output circuits,
   wherein n-bit is an integral equal to or over 1,
   wherein the said decoder is connected to the said replica bit-line circuit, the said address data latch circuit, the said n-bit memory arrays and the said n-bit data selectors respectively, and the said clock circuit is connected to the said replica bit-line circuit, the said n-bit input circuits, the said n-bit output circuits respectively, wherein the jth input circuit is connected to the jth data selector; the said replica bit-line circuit is connected to the said n-bit output circuits, the said jth data selector is connected to the said jth memory array and the said jth output circuit respectively, j=1, 2, ..., n,
   wherein the said output circuit comprises a sensitivity amplifier and a data latch circuit, which is characterized in that the said sensitivity amplifier comprises a 1st, a 2nd, a 3rd, a 4th, a 5th, a 6th and a 7th PMOS transistors and a 1st, a 2nd, the 3rd, a 4th and a 5th NMOS transistors,
   wherein a source of the 1st PMOS transistor, a source of the 4th PMOS transistor and a source of the 5th PMOS transistor are connected to a power supply respectively; a drain of the 1st PMOS transistor and a source of the 2nd PMOS transistor are connected to a source of the 3rd PMOS transistor; a drain of the 2nd PMOS transistor, a gate of the 3rd PMOS transistor, a drain of the 4th PMOS transistor, a drain of the 6th PMOS transistor, a drain of the 1st NMOS transistor and a gate of the 2nd NMOS transistor are connected to a drain of the 4th NMOS transistor respectively, and a common connection thereof is a 1st output terminal of the said sensitivity amplifier,
   wherein a gate of the 2nd PMOS transistor, a drain of the 3rd PMOS transistor, a drain of the 5th PMOS transistor, a drain of the 7th PMOS transistor, a gate of the 1st NMOS transistor and a drain of the 2nd NMOS transistor are connected to a drain of the 5th NMOS transistor respectively, and a common connection thereof is a 2nd input terminal of the said sensitivity amplifier,
   wherein a gate of the 1st PMOS transistor and a gate of the 4th NMOS transistor are connected to a gate of the 5th NMOS transistor, and a common connection thereof is a SADIS terminal of the said sensitivity amplifier, wherein the SADIS terminal of the said sensitivity amplifier is used to couple discharging signals to sensitivity amplifier,
   wherein a gate of the 4th PMOS transistor is connected to a gate of the 5th PMOS transistor, and a common connection thereof is a SAPRE terminal of the said sensitivity amplifier, the SAPRE terminal of the said sensitivity amplifier is used to couple charging signals to the sensitivity amplifier,
   wherein a gate of the 6th PMOS transistor is connected to a gate of the 7th PMOS transistor, and a common connection thereof is a SASEL terminal of the said sensitivity amplifier, the SASEL terminal of the said sensitivity amplifier is used to couple read signals to the sensitivity amplifier,
   wherein a gate of the 3rd NMOS transistor serves as a SAE terminal of the said sensitivity amplifier, the SAE terminal of the said sensitivity amplifier is used to couple enabling signals to the sensitivity amplifier, wherein a source of the 1st NMOS transistor and a source of the 2nd NMOS transistor are connected to the drain of the 3rd NMOS transistor respectively, and a source of the 3rd NMOS transistor, a source of the 4th NMOS transistor and a source of the 5th NMOS transistor are grounded respectively, wherein a source of the 6th PMOS transistor serves as a 1st signal input terminal of the said sensitivity amplifier, and a source of the 7th PMOS transistor serves as a 2nd signal input terminal of the said sensitivity amplifier, wherein the 1st signal input terminal of the said sensitivity amplifier serves as a BL terminal of the output circuit of the said static RAM, and the 2nd signal input terminal of the said sensitivity amplifier serves as a BLB terminal of the output circuit of the said static RAM, wherein the BL terminal and the BLB terminal of the output circuit of the said static RAM are used to connect the data selector to receive bit-line pairs, wherein the said data latch circuit comprises two NOR gates, a 8th PMOS, transistor, a 9th PMOS transistor, a 10th PMOS transistor, a 11th PMOS transistor, a 6th NMOS transistor, a 7th NMOS transistor, a 8th NMOS transistor, a 9th NMOS transistor and a 10th NMOS transistor, wherein the said two NOR gates comprise the 1st NOR gate and the 2nd NOR gate, and each of the said 1st and 2nd NOR gates comprises a 1st input terminal, a 2nd input terminal and an output terminal, wherein a source of the 9th PMOS transistor and a gate of the 6th NMOS transistor are connected to the power supply, the 1st input terminal of the 1st NOR gate serves as a 1st input terminal of the said data latch circuit, and the 1st input terminal of the said data latch circuit is connected to the 1st output terminal of the said sensitivity amplifier, wherein the 2nd input terminal of the 1st NOR gate, the output terminal of the 2nd NOR gate and a gate of the 10th PMOS transistor are connected to a gate of the 10th NMOS transistor, wherein the output terminal of the 1st NOR gate, the 1st input terminal of the 2nd NOR gate, a source of the 6th NMOS transistor, a source of the 11th PMOS transistor and a gate of the 8th PMOS transistor are connected to a gate of the 9th NMOS transistor, wherein the 2nd input terminal of the 2nd NOR gate serves as a 2nd input terminal of the said data latch circuit, and the 2nd input terminal of the said data latch circuit is connected to the 2nd input terminal of the said sensitivity amplifier, wherein a drain of the 9th PMOS transistor is connected to a source of the 8th PMOS transistor, wherein a gate of the 9th PMOS transistor is connected to a gate of the 7th NMOS transistor, and a common connection thereof is a OUTDIS terminal of the said data latch circuit, and the OUTDIS terminal of the said data latch circuit is used to receive discharging control signals from the output terminal, wherein a source of the 10th PMOS transistor, a drain of the 10th PMOS transistor, a drain of the 10th NMOS transistor, a source of the 10th NMOS transistor, a source of the 8th NMOS transistor, a source of the 9th NMOS transistor, a source of the 7th NMOS transistor and a gate of the 11th PMOS transistor are grounded, and a drain of the 6th NMOS transistor and a drain of the 11th PMOS transistor are connected to a gate of the 8th NMOS transistor, wherein a drain of the 8th PMOS transistor, a drain of the 8th NMOS transistor and a drain of the 9th NMOS transistor are connected to a drain of the 7th NMOS transistor, and common connection thereof is an output terminal of the said data latch circuit, and the output terminal of the said data latch circuit serves as an output terminal of the output circuit of the said static RAM.

2. The static RAM for Differential Power Analysis Resistance according to claim 1, wherein the said input circuit comprises a 11th NMOS transistor, a 12th NMOS transistor, a 13th NMOS transistor, a 14th NMOS transistor, a 15th NMOS transistor, a 16th NMOS transistor, a 17th NMOS transistor, a 18th NMOS transistor, a 19 NMOS transistor, a 20th NMOS transistor, a 21st NMOS transistor, a 12th PMOS transistor, a 13th PMOS transistor, a 14th PMOS transistor, a 15th PMOS transistor, a 16th PMOS transistor, a 17th PMOS transistor, a 18th PMOS transistor, a 19th PMOS transistor, a 20th PMOS transistor, a 21st PMOS transistor, a 22nd PMOS transistor, a 23rd PMOS transistor and a 24th PMOS transistor, wherein a source of the 12th PMOS transistor, a source of the 14th PMOS transistor, a source of the 16th PMOS transistor, a source of the 17th PMOD transistor, a source of the 18th PMOS transistor, a source of the 20th PMOS transistor, a source of the 22nd PMOS transistor, a source of the 23rd PMOS transistor and a source of the 24th PMOS transistor are connected to the power supply respectively; a drain of the 12th PMOS transistor is connected to a source of the 13th PMOS transistor, wherein a drain of the 13th PMOS transistor, a drain of the 11th NMOS transistor, a drain of the 15th PMOS transistor and a drain of the 13th NMOS transistor, a gate of the 16th PMOS transistor are connected to a gate of the 15th NMOS transistor, wherein a source of the 11th NMOS transistor is connected to a drain of the 12th NMOS transistor, wherein a source of the 12th NMOS transistor, a source of the 14th NMOS transistor, a source of the 15th NMOS transistor, a source of the 19th NMOS transistor and a source of the 21st NMOS transistor are grounded respectively, wherein a drain of the 14th PMOS transistor is connected to a source of the 15th PMOS transistor, wherein a source of the 13th NMOS transistor is connected to a drain of the 14th NMOS transistor, wherein a gate of the 14th PMOS, a gate of the 14th NMOS transistor, a drain of the 15th NMOS transistor, a drain of the 16th PMOS transistor, a gate of the 17th PMOS transistor, a gate of 16th NMOS transistor, a gate of 19th NMOS transistor are connected to a gate of the 20th PMOS transistor, wherein a drain of the 17th PMOS transistor, a drain of the 16th NMOS transistor, a gate of the 17th NMOS transistor are connected to a gate of the 18th PMOS transistor, wherein a drain of the 17th NMOS transistor, a drain of the 18th PMOS transistor and a source of the 18th NMOS transistor are connected to the source of the 19th PMOS transistor, wherein a drain of the 18th NMOS transistor, a drain of the 19th PMOS transistor are connected to a drain of the 22nd PMOS transistor, and a common connection thereof is a 1st output terminal of the said input circuit, wherein a drain of the 19th NMOS transistor, a drain of the 20th PMOS transistor, a source of the 20th NMOS transistor are connected to a source of the 21st PMOS transistor, wherein a drain of the 20th NMOS transistor, a drain of the 21st PMOS transistor are connected to a drain of the 23rd PMOS transistor, and a common connection thereof is a 2nd output terminal of the said input circuit, wherein a gate of the 12th PMOS transistor, a gate of the 18th NMOS transistor, a gate of the 20th NMOS transistor, a gate of the 13th NMOS transistor and a gate of the 21st NMOS transistor are connected to a gate of the 24th PMOS transistor, and a common connection thereof is a clock signal input terminal of the said input circuit, used to receive write-in signals output from the said clock circuit, wherein a gate of the 12th NMOS transistor, a gate of the 15th PMOS transistor, a drain of the 24th PMOS transistor, a drain of the 21st NMOS transistor, a gate of the 19th PMOS transistor are connected to a gate of the 21st PMOS transistor, and a common connection thereof is an inverted clock signal input terminal of the said input circuit, used to receive inverted signals among write-in signals output from the said clock module, wherein a gate of the 13th PMOS transistor is connected to a gate of the 11th NMOS transistor, and a common connection thereof is a signal input terminal of the said input circuit, used to receive external data, wherein a gate of the 22nd PMOS transistor is connected to a gate of the 23rd PMOS transistor, and a common node is a charging signal input terminal of the said input circuit, used to receive charging signals output from the said clock circuit.

\* \* \* \* \*